METHOD OF MANUFACTURING A FIELD EFFECT SEMICONDUCTOR DEVICE

Original Filed May 28, 1968

INVENTORS
HIROTO KAWAGOE
MASAHARU KUBO

BY Craig & Antonelli
ATTORNEYS

United States Patent Office 3,623,217

Patented Nov. 30, 1971

3,623,217

METHOD OF MANUFACTURING A FIELD EFFECT SEMICONDUCTOR DEVICE

Hiroto Kawagoe, Kodaira-shi, and Masaharu Kubo, Kokubunji-shi, Japan, assignors to Hitachi, Ltd., Chiyoda-ku, Tokyo, Japan Original application May 28, 1968, Ser. No. 732,664. Divided and this application Nov. 26, 1969, Ser. No. 880,409

Int. Cl. B01j *17/00;* H01g *13/00*

U.S. Cl. 29—571 3 Claims

ABSTRACT OF THE DISCLOSURE

A method of manufacturing an MIS type FET, wherein, after source and drain regions are formed in a surface of a semiconductor body, a part of an insulating film which has been used as a selective diffusion mask is removed to expose a carrier path between the regions and a continuous part of the source region, while the other part of the insulating film covering the semiconductor surface, especially, the surface portion of the drain region adjacent to the carrier path is left, then the exposed surface of the body is again covered with a further insulating film which is thinner than that of the remaining insulating film, and then a control electrode is formed on the further insulating film.

CROSS REFERENCE

This application is a divisional application of U.S. Ser. No. 732,664 filed on May 28, 1968, now abandoned.

BACKGROUND OF THE INVENTION

Field of the invention

This invention relates to a method of manufacturing improved insulated gate type field effect semiconductor devices, and more particularly to a method of manufacturing so-called MIS (Metal-Insulator-Semiconductor) field effect transistors which are suitable for use in memory circuits.

Description of the prior art

In the field of electronics, a semiconductor device comprising a conducting path or carrier path of a semiconductor of one conductivity type through which majority carriers pass, a source region connected to one end of the conducting path to supply the majority carriers thereto, a drain region connected to the other end of the conducting path to drain the majority carrier therefrom, and a gate electrode provided on the conducting path but insulated therefrom to control the flow of the majority carriers, is well-known and often called an insuated gate type field effect semiconductor device or an MIS field effect semiconductor device.

Recently, these kinds of semiconductor devices, specifically a so-called MIS field effect transistor (hereinafter referred to as MIS FET), are widely used in a linear amplifier circuit, a digital circuit, etc. The MIS FET, which is a voltage control type of element, is simpler in structure compared with a bipolar transistor which is a current control type of element. If an MIS FET operative in the enhancement mode is used, the manufacturing method becomes simple as the process of isolation among a plurality of MIS FET's is not required. Therefore, it is widely practised to integrate a plurality of MIS FET's in a single semiconductor substrate.

For example, a logical circuit and a temporary memory circuit can simply be constitued using a plurality of enhancement mode MIS FET's. Combination of a plurality of such memory circuits can simply constitute a flipflop circuit, a counter circuit, a register circuit, etc. As described above, since the MIS FET is suitable for integration, the above kinds of circuits can easily be integrated in a semiconductor substrate. Various integrated circuits thus obtained are used in a digital computer, etc. and contribute to a great degree to the miniaturization and high reliability thereof.

However, while such a prior art MIS FET has been utilized in an integrated circuit or as individual units in an electronic circuit, there has still been room for further improvement due to the facts that the insulating film just under the gate electrode is liable to break down, that the electric capacitance between the gate input electrode and the drain region is large, and that it is difficult to set arbitrarily the electric capacitance between the gate electrode and the source region.

SUMMARY OF THE INVENTION

An object of this invention is to provide an improved novel method of making an insulated gate type field effect semiconductor device.

Another object of this invention is to provide a method of manufacturing an MIS field effect semiconductor device having a large input capacitance and being suitable for a memory circuit, etc.

A further object of this invention is to provide a method of manufacturing an insulated gate type field effect transistor in which the insulated gate electrode is hard to break down.

Still another object of this invention is to provide a method of manufacturing an insulated gate type field effect transistor in which the electric capacitance between the gate electrode and the drain region is reduced.

Briefly, the gist of this invention consists in a method of manufacturing an insulated gate type field effect semiconductor device comprising a carrier path contained in a semiconductor of one conductivity type, a source region supplying majority carriers to the carrier path, a drain region draining the majority carriers out of the carrier path, and a gate conducting layer (a controlling electrode layer) extending over but insulated from the carrier path and the drain and source regions by an insulating film, wherein the insulating film is made so as to be thinner at the part thereof covering the carrier path and the source region than at the part covering other surface parts of the semiconductor.

In this specification, the carrier path means a conducting path through which the carrier flows with and without the application of a gate voltage.

BRIEF DESCRIPTION OF THE DRAWINGS

FIG. 2*c* is a sectional view taken along the line II*c*—II*c* of FIG. 3.

DESCRIPTION OF THE PREFERRED EMBODIMENT

In order to understand this invention easily a brief description of a prior art MIS FET will be made first.

Figure 1:
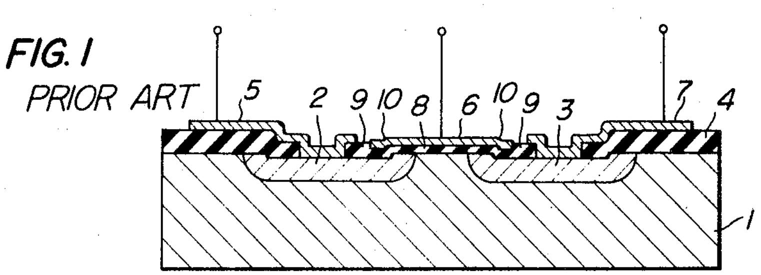
FIG. 1 PRIOR ART
FIG. 1 is a sectional view showing a prior art insulated gate type field effect transistor.

FIG. 1 is a sectional view of a MIS FET which has been generally explained. The manufacturing steps are as follows.

(1) A portion of an insulating film 4 (thickness $t_1$) formed on the surface of a substrate 1 of one conductivity type is removed. An impurity of another conductivity type is diffused into the substrate 1 utilizing the insulating film 4 as a mask to form a source region 2 and a drain region 3.

At this time an insulating film 9 having a thickness of $t_2$ is thermally formed in the portion where the insulating film 4 is removed.

(2) A part of the insulating film 4 on the gate region and a part of the insulating film 9 on the source and drain regions are removed and an insulating film 8 having a thickness $t_3$ is thermally formed.

The substrate 1 is made of silicon, and the insulating films are most generally made of silicon dioxide.

The thickness of the insulating films 4, 9 and 8 are 10,000 A., 6,000 A. and 1,500 A. respectively, i.e. the relation $t_1>t_2>t_3$ holds.

(3) A part of the insulating film 9 is removed and a source electrode 5 and a drain electrode 7 are formed.

A gate electrode 6 is formed on the insulating film 8.

The MIS FET having the above-mentioned structure has the following defects.

(1) Since the insulating film 8 is formed more or less thinner in the step portion 10, the electric field is liable to concentrate on this portion and cause an occasional break down.

(2) Since the gate electrode 6 and the drain region 3 have a relatively large opposing area, the electric capacitance $C_{gd}$ between the gate and drain regions becomes large so that the electric coupling between the input and the output increases to distort the output waveform.

(3) The electric capacitance $C_{gs}$ between the gate and the source is substantially equal to $C_{gd}$ but too small to form a memory circuit.

Next, an embodiment of this invention will be explained. It will be seen that the defects of the prior art device will appropriately be obviated in the embodiment.

Although in the following embodiment a bar gate type MIS FET will be demonstrated as an example, it is too be noted that the technical idea expressed in this embodiment can substantially equally be applied to a ring gate type MIS FET in which a drain region (a source region) surrounds a source region (a drain region) and a ring-shaped gate is disposed between the source and drain regions.

Figure 4:
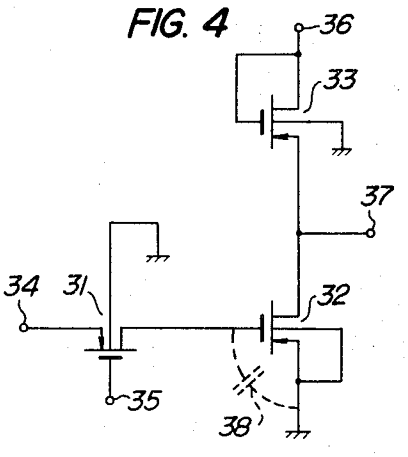
FIG. 4 shows a circuit diagram of a memory circuit to be integrated in a semiconductor substrate, wherein the field effect transistor according to this invention is effectively utilized in the memory circuit.

According to one embodiment of this invention, a temporary memory circuit as exhibited in FIG. 4 is integrated in a semiconductor substrate. The formation of three MIS FET's 31, 32 and 33 and the necessary connection among them are made in accordance with a common integration method. In FIG. 4, MIS FET 32 is specifically closely related to this invention. Accordingly, the portion corresponding to the MIS FET 32 in the integrated memory circuit which is formed in a semiconductor substrate will be illustrated in FIGS. 2*a* to 2*c* and FIG. 3 to disclose the embodiment of this invention.

Figure 2A:
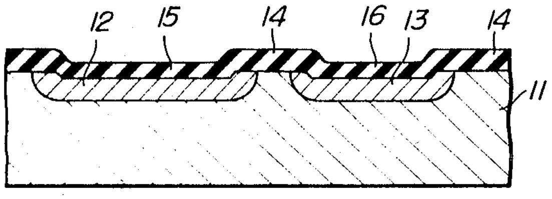
FIGS. 2*a* to 2*c* are sectional views showing the manufacturing steps of an insulated gate type field effect transistor according to one embodiment of this invention included in a semiconductor integrated circuit.
Figure 2C:
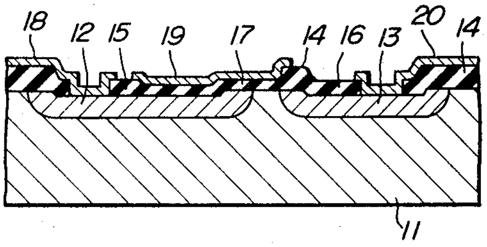
Figure 2B:
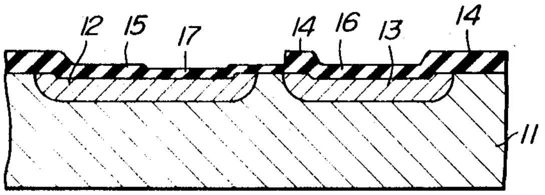
Figure 3:
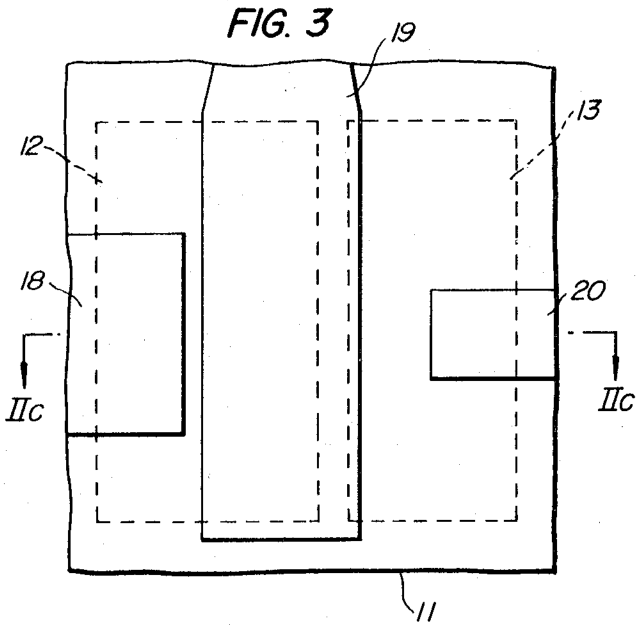
FIG. 3 is a top view corresponding to the sectional view of the field effect transistor shown in FIG. 2*c*. Namely

The structure of the MIS FET in the embodiment of this invention is made clear in FIG. 3, and in FIG. 2 showing a cross-section taken along the line II*c*—II*c* in FIG. 3. For the sake of brevity the insulating film is omitted in FIG. 3.

The characteristics of this MIS FET lie in the facts that an insulated gate electrode 19 is provided at a large distance from a drain electrode 20 but in the neighborhood of a source electrode 18, that the area of the insulated gate electrode 19 extending over the source region 12 is larger than that over the drain region 13, and that the insulated gate electrode 19 is insulated from the drain region 13 by a thick oxide film 14 while insulated from the source region 12 by a thin oxide film 17.

Hereafter, explanation will be provided concerning the manufacturing method of the MIS FET.

First, as shown in FIG. 2*a*, on one principal surface of a semiconductor substrate of first conductivity type, e.g. an N type silicon substrate 11, second conductivity type i.e. P type source and drain regions 12 and 13 are formed about 2 to 5$\mu$ deep by introducing boron, etc., through the use of the well-known selective diffusion method with the insulating film 14 such as silicon oxide as a selective mask. In this case, thermally grown new silicon oxide films 15 and 16 are formed on the source and drain regions respectively. The oxide film 14 is selected to be 10,000 A. to 15,000 A. thick while the oxide films 15 and 16 3,000 to 6,000 A. thick. The surface layer of the substrate existing between the source region 12 and the drain region 13 becomes a carrier path region.

Next, as shown in FIG. 2*b*, a part of the oxide film 15 lying on the source region 12 and a part of the oxide film 14 lying on the carrier path between the source and drain regions are removed to form on the exposed surface of the semiconductor substrate a silicon oxide film 17 having a thickness of about 1,000 to 2,000 A. This oxide film 17 is thermally formed, or deposited from vapor phase as occasion demands, so as to extend 5 to 15$\mu$ on the source region.

In the final stage, as shown in FIG. 2*c*, a source electrode 18, a gate electrode 19 and a drain electrode 20 are formed using the well-known evaporation and photo-etching techniques. FIG. 3 shows a top view corresponding to the sectional view of FIG. 2. It can be understood from FIG. 2*c* and FIG. 3 that the gate electrode 19 extends together with the thin insulating film 17 over the source region 12, the area extending over the source region being larger than that extending over the drain region 13. The gate electrode 19 extends only slightly on a thick insulating film 14 over the drain region 13. For example, in FIG. 2*c*, the gate electrode 19 extends from the end portion of the carrier path about 5 to 15$\mu$ towards the source region 12 and about 0 to 5$\mu$ towards the drain region 13. Preferably it extends towards the source region more than twice as far as towards the drain region. Generally, it is known that the capacitance of a parallel plane capacitor is proportional to the opposing area of the two electrodes and the dielectric constant of a dielectric inserted therebetween while inversely proportional to the distance between the two electrodes. Therefore, it is apparent in the MIS FET obtained in the above embodiment of this invention that the capacitance $C_{gs}$ between the gate electrode and the source region is increased while the capacitance $C_{gd}$ between the gate electrode and the drain region is decreased. The value of $C_{gs}$ can be arbitrarily selected as 5 to 10 pF.

Thus, according to this embodiment, since the gate electrode 19 does not extend on the boundary between the oxide films 14 and 16 (where breakdown often occurred in the prior art device), the breakdown can be prevented. Further, since the gate electrode 19 extends together with the thick insulating film 14 over the drain region 13, the breakdown of the insulating film between the gate electrode and the drain region is out of the question.

The decreased $C_{gd}$ reduces the electrostatic coupling between the input and output terminals to make the output characteristic of the MIS FET better.

The increased capaciance $C_{gs}$ makes the MIS FET be a semiconductor element suitable for a memory circuit.

Next, explanation will be given of how such an MIS FET will be effectively utilized in a circuit shown in FIG. 4 Although this circuit is integrated in a semiconductor substrate in this embodiment, integration is not always necessary. It may be constituted by connecting individual MIS FET's. In the temporary memory circuit 31, 32 and 33 are depicted as P channel enhancement mode MIS FET's. In MIS FET 32, since the capacitance $C_{gs}$ of the capacitor 38 between the gate electrode and the source region is utilized for the information (charge) storage action, the value of $C_{gs}$ is preferably large. An information signal (a constant negative charge corresponding to "1") entering the input terminal i.e. a source electrode 34 of MIS FET 31 is stored in the gate capacitance 38 of MIS FET 32 when a clock signal applied to the gate electrode 35 of MIS FET 31 opens its carrier path. An output terminal 37 is connected to the drain electrode of MIS FET 32 which is connected to a power source terminal 36 having a prescribed negative potential by way of the MIS FET 33 acting as a load resistor. Namely, MIS FET's 32 and 33 constitute a so-called inverter circuit. Therefore, the gate input of MIS FET 32 and the output obtained at the terminal 37 have a phase difference of 180°. The stored information puts the MIS FET 32 in "on" state. When a next clock signal puts the MIS FET 31 in "off," the charge stored in the gate capacitor 38 of MIS FET 32 starts its discharge in accordance with the discharge characteristic depending on the product of the backward resistance of the drain PN junction of MIS FET 31 and the gate capacitance 38. The discharge time lasts more than 10 msec. The terminal 34 at the start of discharge is no longer at a negative potential relative to ground potential. The MIS FET 32 is not inverted to "off" state until a next clock signal is applied to the gate electrode 35 of MIS FET 31 to open its carrier path or the discharge of stored charge reaches the point where the potential of the gate electrode of MIS FET 32 becomes less than the threshold potential thereof. Thus, the information is temporarily stored. It is clear that in such a circuit the information storage time becomes longer when the capacitance 38 between the gate electrode and the source region of MIS FET 32 is larger. Therefore, the MIS FET provided by this invention is utilized effectively as MIS FET 32.

As described hereinabove, according to this invention, it is sufficient that only the gate electrode extends over the source region, without any new process being required. Further, the surface of the semiconductor substrate is not occupied over a wide area by the gate electrode. So, the high density integration of MIS FET is not disturbed through the application of this invention. Since the impurity concentration of the source region is about $10^{19}$ atoms/cc. and higher than that of the substrate, it is more desirable in view of capacitance and loss to form the capacitor between the gate electrode and the highly doped source region than to form it between the gate electrode and the substrate by extending the gate electrode over the surface of the substrate other than the source region.

Although a particular embodiment of this invention has been described hereinabove, this invention is not limited thereto. When the substrate and the source region are short-circuited, it is possible as occasion demands for those skilled in the art to obtain an MIS FET having a large capacitance between the gate and the source by extending the gate electrode together with the insulating film not only over the source region but also over the substrate in the neighborhood of the source region.

Although in the above embodiment of this invention P channel enhancement mode MIS FET's have been shown, this invention may also be applied if necessary to depletion mode MIS FET's.

Although in the above embodiment the insulating films on the source region and the carrier path are made especially thin, this is not always necessary if the required large capacitance $C_{gs}$ is obtained by extending the gate electrode over the source region in a wide area.

This invention may be applied to an insulated gate type thin film field effect transistor in which a semiconductor thin film disposed on a substrate acts as a carrier path.

We claim:

1. A method of manufacturing a field effect semi-conductor device comprising the steps of:

preparing a semiconductor substrate having a first conductivity type and having a first insulating film on a major surface thereof;

forming a pair of first and second holes in said first insulating film to expose a pair of substrate surface portions;

diffusing a second conductivity type determining impurity through said pair of holes into said substrate to form second conductivity type source and drain regions which define a carrier path in the substrate surface portion therebetween;

forming second and third insulating films each having a thickness smaller than that of said first insulating film in said first and second holes so as to cover the surfaces of said second conductivity type regions, respectively;

perforating said second insulating film and the first insulating film between said first and second holes to expose said carrier path and a portion of a first of said second conductivity type regions adjacent to said carrier path while leaving said first insulating film on a portion of the second of said second conductivity type regions adjacent to said carrier path;

forming a fourth insulating film having a thickness smaller than those of said second and third insulating films on the exposed carrier path and the exposed adjacent portion of said first of said second conductivity type regions;

providing a control electrode on said fourth insulating film and on a portion of the remaining first insulating film to cover said carrier path region and a portion of each of said first and second second conductivity type regions which is adjacent to said carrier path; and fixing first and second electrodes on said first and second second conductivity type regions, respectively.

2. A method of manufacturing a semiconductor device according to claim 1, wherein said fourth insulating film comprises silicon oxide which is deposited from a vapor phase.

3. A method of manufacturing a semiconductor device according to claim 1, wherein said first of said second conductivity type regions is said source region, said second of said second conductivity type regions is said drain region and said control electrode is provided on said fourth insulating film so that the area of said control electrode overlying said source region is at least twice as great as the area thereof overlying said drain region.

References Cited

UNITED STATES PATENTS

| | | | |
|---|---|---|---|
| 3,296,508 | 1/1967 | Hofstein | 317—235 |
| 3,339,128 | 8/1967 | Olmstead | 317—235 |
| 3,453,506 | 7/1969 | Okumura | 317—235 |
| 3,504,430 | 4/1970 | Kubo | 29—571 |

JOHN F. CAMPBELL, Primary Examiner

W. TUPMAN, Assistant Examiner

U.S. Cl. X.R.

29—578; 317—235 B

UNITED STATES PATENT OFFICE

CERTIFICATE OF CORRECTION

Patent No. 3,623,217 Dated November 30, 1971

Inventor(s) Hiroto Kawagoe and Masaharu Kubo

It is certified that error appears in the above-identified patent and that said Letters Patent are hereby corrected as shown below:

Title Page

The following should be inserted:

"Foreign Application Priority Data

Japan June 2, 1967 34846/67"

Signed and sealed this 13th day of June 1972.

(SEAL)
Attest:

EDWARD M.FLETCHER,JR.
Attesting Officer

ROBERT GOTTSCHALK
Commissioner of Patents